United States Patent [19]

Matsumoto

[11] Patent Number: 5,041,743

[45] Date of Patent: Aug. 20, 1991

[54] EMITTER-FOLLOWER CIRCUIT WITH REDUCED DELAY TIME

[75] Inventor: Kouji Matsumoto, Tokyo, Japan

[73] Assignee: NEC Corporation, Tokyo, Japan

[21] Appl. No.: 558,308

[22] Filed: Jul. 25, 1990

[30] Foreign Application Priority Data

Jul. 27, 1989 [JP] Japan ................................. 1-194774

[51] Int. Cl.⁵ ................. H03K 19/086; H03K 19/092; H03K 19/013
[52] U.S. Cl. ................................... 307/455; 307/443; 307/475
[58] Field of Search ......................... 307/443, 455, 475

[56] References Cited

U.S. PATENT DOCUMENTS

| | | | |
|---|---|---|---|
| 3,602,735 | 8/1971 | Lodi | 307/455 |
| 4,321,490 | 3/1982 | Bechdolt | 307/443 |
| 4,498,022 | 2/1985 | Koyama et al. | 307/443 |
| 4,855,622 | 8/1989 | Johnson | 307/443 |
| 4,877,977 | 10/1989 | Kokado | 307/443 |
| 4,896,058 | 1/1990 | Murray | 307/443 |
| 4,912,344 | 3/1990 | Yin | 307/443 |
| 4,972,104 | 11/1990 | Estrada | 307/443 |

*Primary Examiner*—Stanley D. Miller
*Assistant Examiner*—Scott A. Ouellette
*Attorney, Agent, or Firm*—Whitham & Marhoefer

[57] ABSTRACT

The emitter-follower circuit of the invention, having a current-switching type logic circuit operating between the ground potential and the first negative power supply potential, comprises an emitter-follower transistor having its emitter connected to an output terminal; a first transistor having its collector connected to the ground potential; a second transistor having its base connected to the emitter of the first transistor and its emitter connected to the second negative power supply potential; and a diode connected between the base of the first transistor and the output terminal. The emitter-follower circuit may further comprises an input emitter-follower circuit stage and a differential circuit which make the speed of turn-off operation of the second transistor high. The second transistor receives at its base a signal whose phase is inverted with respect to the phase of the signal received by the emitter-follower transistor from the current-switching type logic circuit. In the transition of the output signal changing from its High to Low level, the second transistor serves to provide a current-path for discharging the charge which was charged in a capacitance of the load, whereby the delay time is shortened without a noise margin being decreased.

5 Claims, 9 Drawing Sheets

EMITTER-FOLLOWER CIRCUIT WITH REDUCED DELAY TIME

BACKGROUND OF THE INVENTION

The present invention relates to an emitter-follower circuit and, more particularly, to an emitter-follower circuit in which a delay time due to a load capacitance is improved and accordingly an operation speed is increased.

Conventionally, an emitter-coupled type logic circuit, ECL circuit, is known as a digital logic circuit which is capable of operating at a high speed. The ECL circuit has an emitter-follower circuit at an output stage for the purpose of enhancement of the driving capability for the load applied thereto. It has been a general practice to have the emitter-follower circuit formed with an emitter-follower transistor and a terminating resistor, between the ground potential and a first negative power supply potential $V_{EE}$ (generally, $-4.5$ V or $-5.2$ V is adopted). However, the trend in the recent years is that, in order to decrease power consumption of the circuit, such an emitter-follower circuit is often formed between the ground potential and a second negative power supply potential $V_T$ (generally, $-2$ V). This trend is more remarkable in integrated ECL logic circuits with high packing density.

In the conventional emitter-follower circuit, it has been a drawback that, in the transition of the output signal changing from its High to Low level, the delay time which is determined by the time constant of the value of the load capacitance and the value of the terminating resistor is greatly increased depending on the increase in the capacitance of the load so that the operation speed of the circuit is lowered. If, in such conventional emitter-follower circuit, the resistance value of the terminating resistor is made small in order to decrease the delay time, the current which flows in the terminating resistor increases when the output signal is High so that the level of the High output signal is lowered thereby deteriorating the noise margin.

SUMMARY OF THE INVENTION

It is, therefore, an object of the present invention to eliminate or overcome the drawbacks existing in the conventional emitter-follower circuits and to provide an improved emitter-follower circuit.

It is another object of the invention to provide an improved emitter-follower circuit wherein the delay time at the transition of the output signal changing from its High to Low level is shortened without the noise margin being decreased.

According to one aspect of the invention, there is provided an emitter-follower circuit having a ground potential terminal and a first and a second negative power supply terminal and a current-switching type logic circuit formed between the ground potential terminal and the first negative power supply terminal, the emitter-follower circuit comprising:

- an emitter-follower transistor having its base connected to one output of the current-switching type logic circuit, its collector connected to the ground potential terminal, and its emitter connected to an output terminal;
- a first transistor having its collector connected to the ground potential terminal and its base connected to the other output of the current-switching type logic circuit;
- a second transistor having its collector connected to the output terminal, its base connected to the emitter of the first transistor, and its emitter connected to the second negative power supply terminal; and
- a diode having its anode connected to the base of the first transistor and its cathode connected to the output terminal.

A first constant-current source or a first resistor may be disposed between the junction of the emitter of the first transistor with the base of the second transistor and the first negative power supply terminal.

Alternatively, it may be arranged that a second resistor is connected between the junction of the emitter of the first transistor with the base of the second transistor and the second negative power supply terminal.

According to another aspect of the invention, the emitter-follower circuit may further comprise:

- an input emitter-follower circuit formed between the ground potential terminal and the first negative power supply terminal and having a third resistor and a third transistor whose base is connected to the input terminal of the current-switching type logic circuit;
- a differential circuit having a fourth transistor whose collector is connected to the emitter of the first transistor and also to the base of the second transistor and whose base is connected to the output of the input emitter-follower circuit, and a fifth transistor whose collector is connected to the ground potential terminal and whose base is connected to a reference voltage source; and
- a second constant-current source connected between the first negative power supply terminal and the tied-together emitters of the fourth and fifth transistors of the differential circuit.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Throughout the following explanation, similar reference symbols or numerals refer to the same or similar elements in all the figures of the drawings.

For the purpose of assisting in the understanding of the present invention, a conventional emitter-follower circuit will first be described by making reference mainly to FIG. 4 before the present invention is explained.

Figure 4:
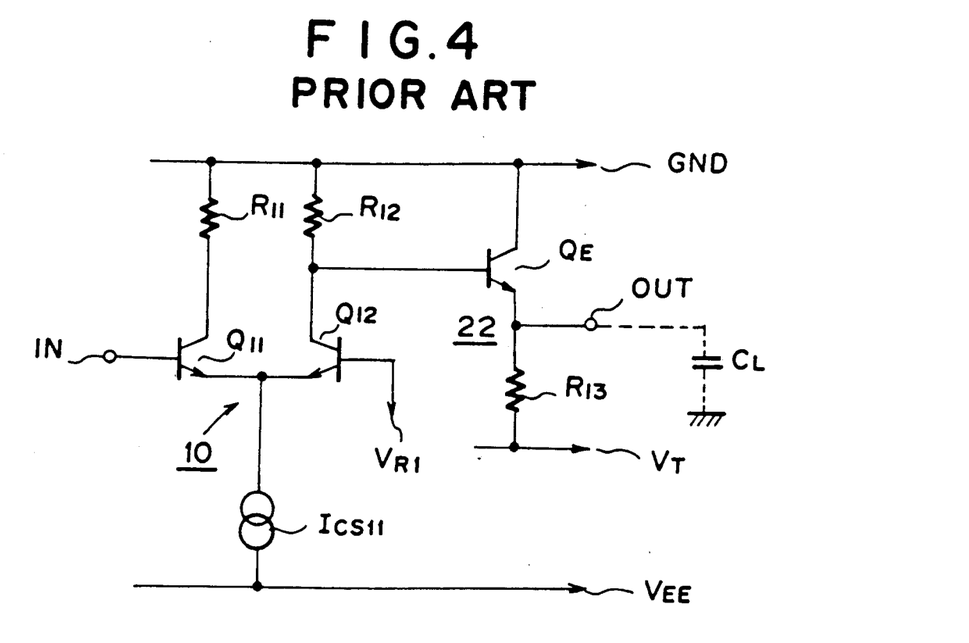
FIG. 4 is a circuit diagram of an ECL circuit incorporating a conventional emitter-follower circuit.

FIG. 4 shows a circuit diagram of an ECL circuit which has a conventional emitter-follower circuit as an output means. Transistors $Q_{11}$, $Q_{12}$ are current-switching transistors having their emitters connected with each other and the base of the one transistor $Q_{11}$ being connected to an input terminal IN while that of the other transistor $Q_{12}$ being connected to a reference potential source $V_{R1}$, thereby performing a differential operation. Between the collector of the transistor $Q_{11}$ and the ground potential line GND, there is connected a collector load resistor $R_{11}$. In the same way, there is connected a collector load resistor $R_{12}$ between the collector of the transistor $Q_{12}$ and the ground potential line GND. Connected between a junction of the emitters of both the current-switching transistors $Q_{11}$, $Q_{12}$ and the first negative power supply potential $V_{EE}$ is a constant-current source $I_{CS11}$. The current-path for the constant-current flowing from the constant-current source $I_{CS11}$ is selected by the current-switching transistors $Q_{11}$, $Q_{12}$ in response to the input signal levels with respect to the reference potential level ($V_{R1}$). The current which flows in the current-switching transistor $Q_{12}$ causes a potential drop across the collector load resistor $R_{12}$, and the resultant signal thus obtained is outputted from the emitter-follower circuit 22 which is formed, between the ground potential line GND and the second negative power supply potential source $V_T$, by an emitter-follower transistor $Q_E$ and a terminating resistor $R_{13}$. Next, the operation of this ECL circuit incorporating the conventional emitter-follower circuit is explained. When a High-level signal whose potential is higher than the reference potential $V_{R1}$ is inputted to the input terminal IN, the one transistor $Q_{11}$ turns to its ON-state while the other transistor $Q_{12}$ turns to its OFF-state, thereby allowing the constant-current $I_{CS11}$ to flow in the collector load resistor $R_{11}$. As a consequence, a High-level output signal $V_{OH}$ is outputted from an output terminal OUT of the emitter-follower circuit, and the value of this output signal $V_{OH}$ may be expressed by the following equation (1):

$$V_{OH} = -R_{12} \cdot I_{BH(QE)} - V_{F(QE)} \quad (1)$$
$$= \frac{R_{12} \cdot V_T - R_{13} \cdot hfe \cdot V_{F(QE)}}{R_{13} \cdot hfe + R_{12}}$$
$$\approx \frac{R_{12} \cdot V_T}{R_{13} \cdot hfe} - V_{F(QE)}$$

wherein $V_{F(QE)}$ is a forward operation voltage of the emitter-follower transistor $Q_E$, $I_{BH(QE)}$ is a base current of the transistor $Q_E$, and hfe is an amplification factor of the transistor $Q_E$.

The base current $I_{BH(QE)}$ of the emitter-follower transistor $Q_E$ may be expressed by the following equation (2):

$$I_{BH(QE)} = \frac{V_{OH} - V_T}{R_{13}} \cdot \frac{1}{hfe} \quad (2)$$

On the contrary, when a Low-level signal whose potential is lower than the reference potential $V_{R1}$ is inputted to the input terminal IN, the one transistor $Q_{11}$ turns to its OFF-state and the other transistor $Q_{12}$ turns to its ON-state, so that the constant-current $I_{CS11}$ is allowed to flow in the collector load resistor $R_{12}$. As a consequence, a Low-level output signal $V_{OL}$ is outputted from the output terminal OUT of the emitter-follower circuit 22, and the value of this Low-level output signal $V_{OL}$ may be expressed by the following equation (3):

$$V_{OL} = -R_{12}(I_{CS11} + I_{BL(QE)}) - V_{F(QE)} \quad (3)$$
$$-R_{12} \cdot R_{13} \cdot hfe \cdot I_{CS11} +$$
$$= \frac{R_{12} \cdot V_T - R_{13} \cdot hfe \cdot V_{F(QE)}}{R_{13} \cdot hfe + R_{12}}$$
$$\approx -R_{12} \cdot I_{CS11} + \frac{R_{12} \cdot V_T}{R_{13} \cdot hfe} - V_{F(QE)}$$

And, the base current $I_{BL(QE)}$ of the emitter-follower transistor $Q_E$ may be expressed by the following equation (4):

$$I_{BL(QE)} = \frac{V_{OL} - V_T}{R_{13}} \cdot \frac{1}{hfe} \quad (4)$$

In the transition state where the output signal of the emitter-follower circuit 22 changes from its Low to High level, the current to charge the load capacitance CL and the current to flow in the terminating resistor $R_{13}$ are supplied from the emitter-follower transistor $Q_E$. On the other hand, in the transition state where the output signal changes from its High to Low level, the emitter-follower transistor $Q_E$ temporarily turns OFF and the charge which was charged in the load capacitance CL is discharged through the terminating resistor $R_{13}$.

In the conventional emitter-follower circuit 22 as explained above, it has been a drawback that, in the transition of the output signal changing from its High to Low level, the delay time determined by the time constant of the value of the load capacitance CL and the value of the terminating resistor $R_{13}$ is greatly increased depending on the increase in the load capacitance CL, thereby lowering the operation speed of the circuit. If, in such conventional emitter-follower circuit, the resistance value of the terminating resistor $R_{13}$ is made small for the purpose of shortening of the delay time, the current which flows in the terminating resistor $R_{13}$ increases when the output signal is High, thereby causing the lowering of the level of the High-level output signal $V_{OH}$ and the deterioration of the noise margin.

For example, in the ECL circuit shown in FIG. 4, assuming that the arrangements are $R_{11}=R_{12}=2$ KΩ, $R_{13}=4$ KΩ, $V_T=-2$ V, hfe=70, and $V_{F(QE)}=0.75$ V, the High-level output signal $V_{OH}$ will be $V_{OH}=-0.764$ V from the equation (1) above. If the value of the terminating resistor $R_{13}$ is reduced to 2KΩ in an attempt to improve the delay time due to the load capacitance CL, the High-level output signal $V_{OH}$ will be $V_{OH}=-0.779$ V, resulting in the deterioration of the noise margin by 15 mV.

Now, the present invention will be explained hereunder in detail with reference to the appended drawings.

Figure 1:
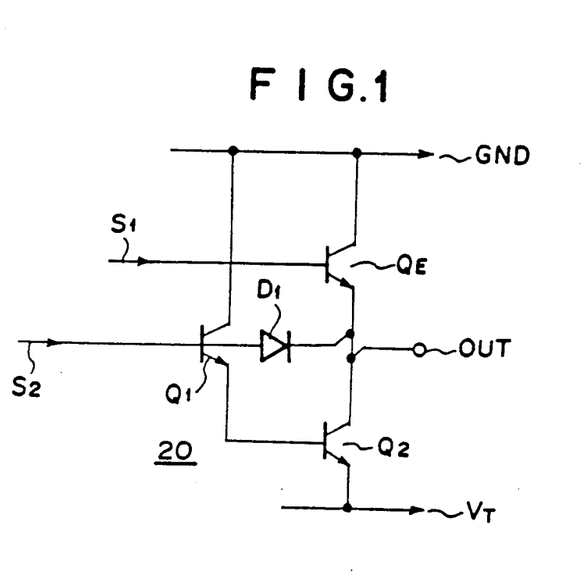
FIG. 1 is a circuit diagram illustrating the representative features of the emitter-follower circuit as in the arrangement according to the present invention.
Figure 2:
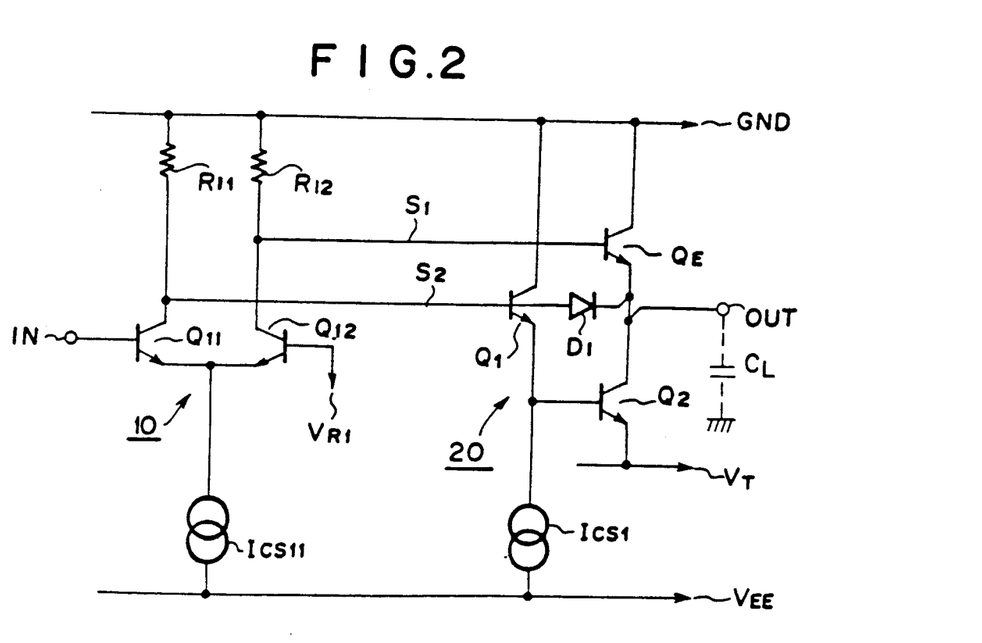
FIG. 2 is a circuit diagram of an ECL circuit incorporating the emitter-follower circuit of the first embodiment according to the present invention.

FIG. 1 is a circuit diagram illustrating the representative features of an emitter-follower circuit 20 as covered by the present invention, and FIG. 2 shows a circuit diagram of an ECL circuit to which the emitter-follower circuit 20 of the first embodiment according to the present invention is incorporated.

First, the circuit configuration of the ECL circuit is explained. In FIG. 2, the transistors $Q_{11}$, $Q_{12}$ are current-switching transistors, one at the side of the input terminal IN and the other at the side of the reference potential source $V_{R1}$. Between each of the collectors of these transistors $Q_{11}$, $Q_{12}$ and the ground potential line GND, there are respectively connected the collector load resistors $R_{11}$, $R_{12}$. Between the common junction of the emitters of the transistors $Q_{11}$, $Q_{12}$ and the first negative power supply potential $V_{EE}$ is interposed the constant-current source $I_{CS11}$. The current-switching type logic circuit 10 is formed with the arrangements just explained above. The emitter-follower circuit 20 shown in FIG. 1 can be connected in such a way that the signal outputted may be of the same phase as or of the inverted phase to the phase of the signal inputted to the current-switching type logic circuit 10, but the circuit shown in FIG. 2 is an example in which the signal outputted from the emitter-follower circuit 20 is of the same phase as the signal inputted to the ECL circuit. That is, the base of the emitter-follower transistor $Q_E$ is connected to the junction of the collector load resistor $R_{12}$ and the collector of the current-switching transistor $Q_{12}$ arranged at the side of the reference voltage source $V_{R1}$. A first transistor $Q_1$ has its base connected to the junction of the collector load resistor $R_{11}$ and the collector of the current-switching transistor $Q_{11}$ at the input terminal side and receives a signal $S_2$ having inverted phase with respect to the signal $S_1$ received by the emitter-follower transistor $Q_E$. The emitter of the first transistor $Q_1$ is connected to the base of a second transistor $Q_2$ and also, in the example shown in FIG. 2, to one end of a constant-current source $I_{CS1}$ whose other end being connected to the first negative power supply potential $V_{EE}$, in order to accelerate the OFF-operation of the second transistor $Q_2$. The second transistor $Q_2$ is connected between the output terminal OUT and the second negative power supply potential $V_T$ and functions to provide a current-path for discharging the charge which was charged in the capacitance CL of the load. The discharging current flows when the output signal changes from its High to Low level, but the discharging operation ends and the output signal is stabilized at Low level when a first diode $D_1$, which has its anode commonly connected to the collector of the transistor $Q_{11}$ and the base of the first transistor $Q_1$ while its cathode commonly connected to the emitter of the emitter-follower transistor $Q_E$, the collector of the second transistor $Q_2$ and the output terminal OUT, turns to its ON-state.

Next, the operation of the emitter-follower circuit 20 according to this first embodiment is explained. When the High-level signal is inputted to the input terminal IN of the differential logic circuit 10, the transistor $Q_{11}$ turns to its ON-state and the transistor $Q_{12}$ turns to its OFF-state. Consequently, the constant-current $I_{CS11}$ flows to the collector load resistor $R_{11}$ whereby a potential drop ($-I_{CS11} \times R_{11}$) is developed across the collector load resistor $R_{11}$. Under this state, the base-emitter voltage $V_{BE(Q2)}$ of the second transistor $Q_2$ may be expressed by the following equation (5):

$$V_{BE(Q2)} = -I_{CS11} \cdot R_{11} - V_{F(Q1)} - V_T \qquad (5)$$

Assuming here that $I_{CS11} = 0.3$ mA, $R_{11} = 2K\Omega$ and $V_T = -2$ V, the base-emitter voltage $V_{BE(Q2)}$ of the second transistor $Q_2$ will be:

$$V_{BE(Q2)} = 0.65 \text{ [V]} < V_{F(Q2)} = 0.75 \text{ [V]} \qquad (6)$$

wherein $V_{F(Q1)}$ and $V_{F(Q2)}$ are respectively the forward operation voltages of the first and second transistors $Q_1$ and $Q_2$ and are 0.75 V. Therefore, the second transistor $Q_2$ turns to its OFF-state. As a consequence, the emitter-follower transistor $Q_E$ is in its ON-state allowing the flow of only the base current for the load gate and the diode $D_1$ is in its OFF-state. This High-level output signal does not cause any deterioration of the noise margin unlike the case with the conventional emitter-follower circuit 20 using the terminating resistor $R_{13}$ since only the base current for the load gate flows to the emitter-follower transistor $Q_E$. On the contrary, when the signal of Low-level is inputted to the input terminal IN, the transistor $Q_{11}$ turns to its OFF-state and the transistor $Q_{12}$ to its ON-state. Here the second transistor $Q_2$ and the diode $D_1$ are both in their ON-state and a current $I_{C(Q2)}$ which flows to the collector load resistor $R_{11}$, the diode $D_1$ and the second transistor $Q_2$ will be as given by the following equation (7):

$$I_{C(Q2)} = \frac{-V_T - V_{F(Q2)} - V_{F(Q1)}}{R_{11}} \qquad (7)$$

Also, the output voltage $V_{OL}$ of Low-level may be expressed by the following equation (8):

$$\begin{aligned} V_{OL} &= V_T + V_{F(Q2)} + V_{F(Q1)} - V_{F(D1)} \\ &\approx -1.25 \text{ [V]} \end{aligned} \qquad (8)$$

wherein $V_{F(D1)}$ is the forward operation voltage of the diode $D_1$ and is 0.75 V.

Further, the base-emitter voltage $V_{BE(QE)}$ of the emitter-follower transistor $Q_E$ will be:

$$\begin{aligned} V_{BE(QE)} &= -I_{CS11} \cdot R_{12} - V_{OL} \\ &\approx 0.65 \text{ [V]} < V_{F(QE)} = 0.75 \text{ [V]} \end{aligned} \qquad (9)$$

wherein $V_{F(QE)}$ is the forward operation voltage of the emitter-follower transistor $Q_E$. Therefore, the transistor $Q_E$ turns to its OFF-state.

Now, the operation in the transition of the output signal changing from its High to Low level is explained. When the input signal changes its level from High to Low, the transistor $Q_{11}$ changes from its ON-state to OFF-state and the base potential of the first transistor $Q_1$ rises in accordance with the time constant by the collector load resistor $R_{11}$ and the parasitic capacitance involved. Therefore, the second transistor $Q_2$ turns to its ON-state and the charges having been charged in the capacitance CL of the load is quickly discharged. This condition continues until the diode $D_1$ turns to its ON-state and the rise of the base potential of the first transistor $Q_1$ stops after the output signal has changed from its High to Low level. The discharging of the charge charged in the load capacitance CL is completed upon the diode $D_1$ turning to its ON-state and, therefore, the output signal becomes stable at the Low-level.

Figure 2A:
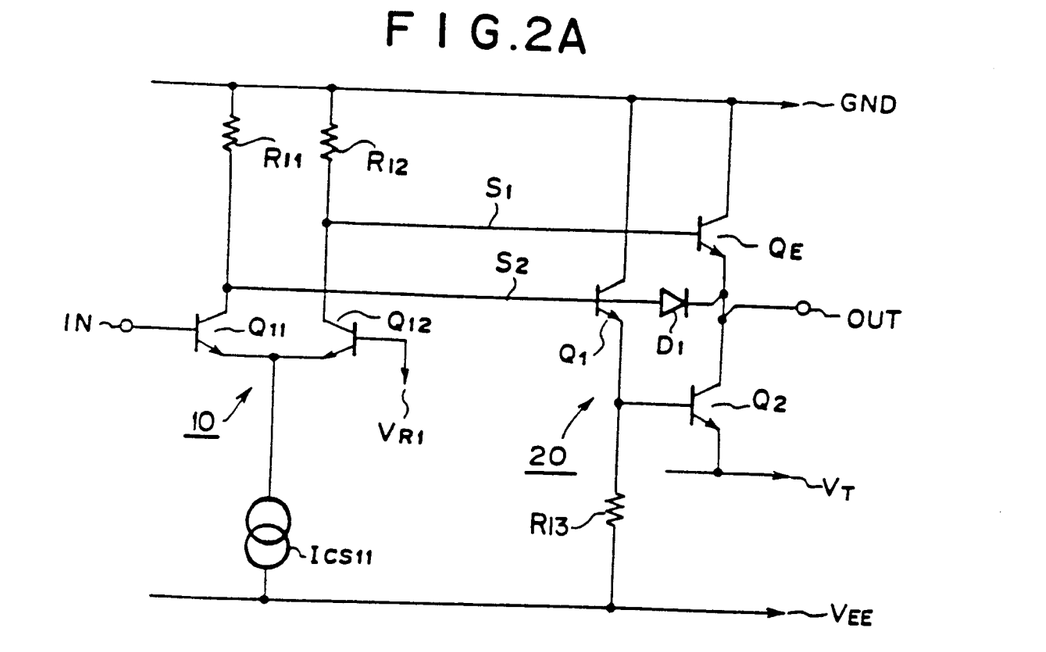
FIGS. 2A and 2B are circuit diagrams showing modifications to the circuit of FIG. 2.
Figure 2B:
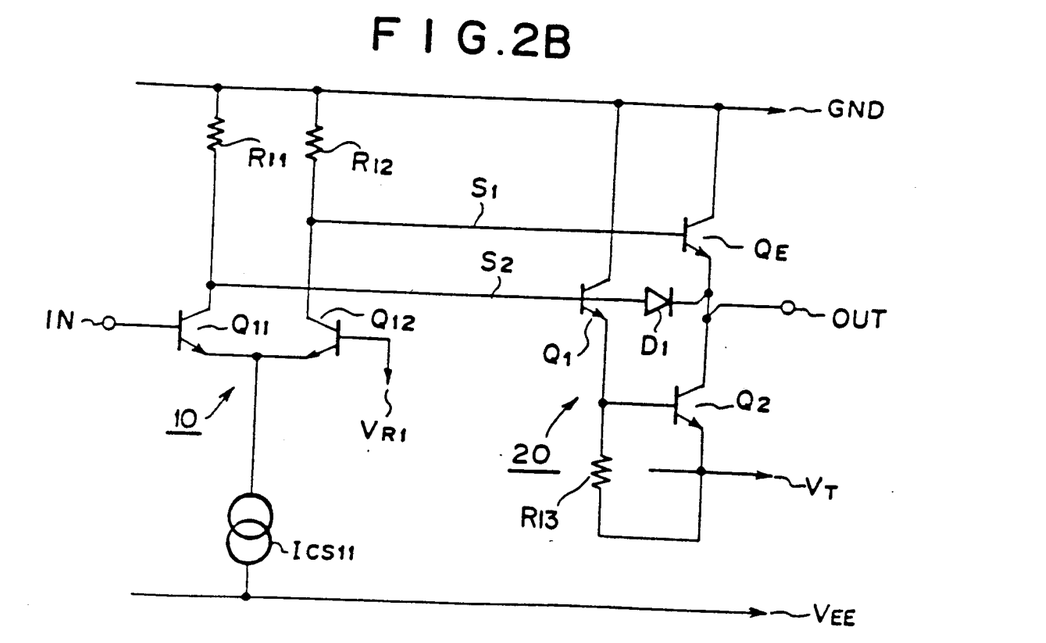

For obtaining the same operation as described above, it should be noted that the constant-current source $I_{CS1}$ in the present embodiment may be substituted by a resistor $R_{13}$ whose one end is connected to the first negative power supply source $V_{EE}$ or the second negative power supply source $V_T$, as shown in FIGS. 2A and 2B, respectively.

Figure 3:
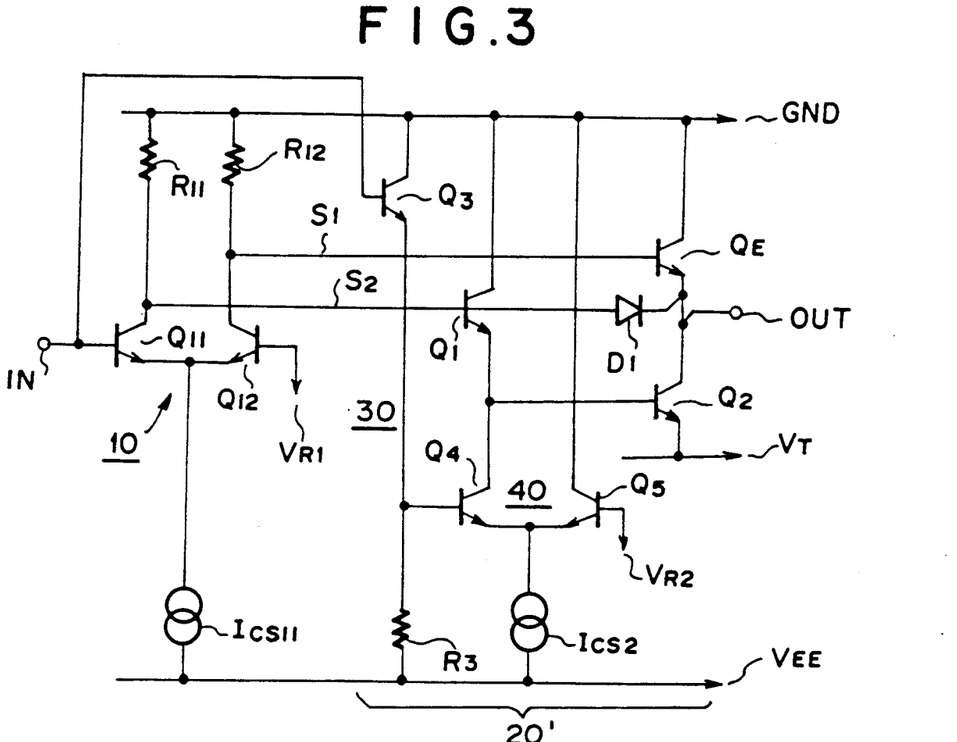
FIG. 3 is a circuit diagram of an ECL circuit incorporating the emitter-follower circuit of the second embodiment according to the present invention.

FIG. 3 shows a circuit diagram of the ECL circuit incorporating the emitter-follower circuit 20' of the second embodiment according to the present invention. In addition to the elements constituting the emitter-follower circuit 20 of the first embodiment shown in FIG. 2, the circuit of this second embodiment further comprises an input emitter-follower circuit 30 which is formed, between the ground potential line GND and the first negative power supply source $V_{EE}$, by a third transistor $Q_3$ and a third resistor $R_3$ and to which is inputted the same signal as that inputted to the current-switching type logic circuit 10. The emitter-follower circuit 20 also comprises a differential circuit 40 which is formed by a pair of fourth and fifth transistors $Q_4$, $Q_5$ whose emitters are connected to each other and which performs a differential operation between the output signal from the input emitter-follower circuit 30 and a second reference potential $V_{R2}$ lower than the first reference potential $V_{R1}$, whereby the turn-OFF operation of the second transistor $Q_2$ is enhanced. In this second embodiment, when the signal of High-level is inputted to the input terminal IN, the fourth transistor $Q_4$ turns to its ON-state and, in the transition of the output signal changing from its Low to High level, the operation speed of the turn-OFF operation of the second transistor $Q_2$ is made high so that the delay time in the transition period of the output signal changing from its Low to High level is effectively improved.

The above explanation all relates to the embodiments in which the emitter-follower circuit according to the invention is used in a buffer circuit, but it is needless to say that the circuit may also be utilized in an invertor circuit.

Figure 5:
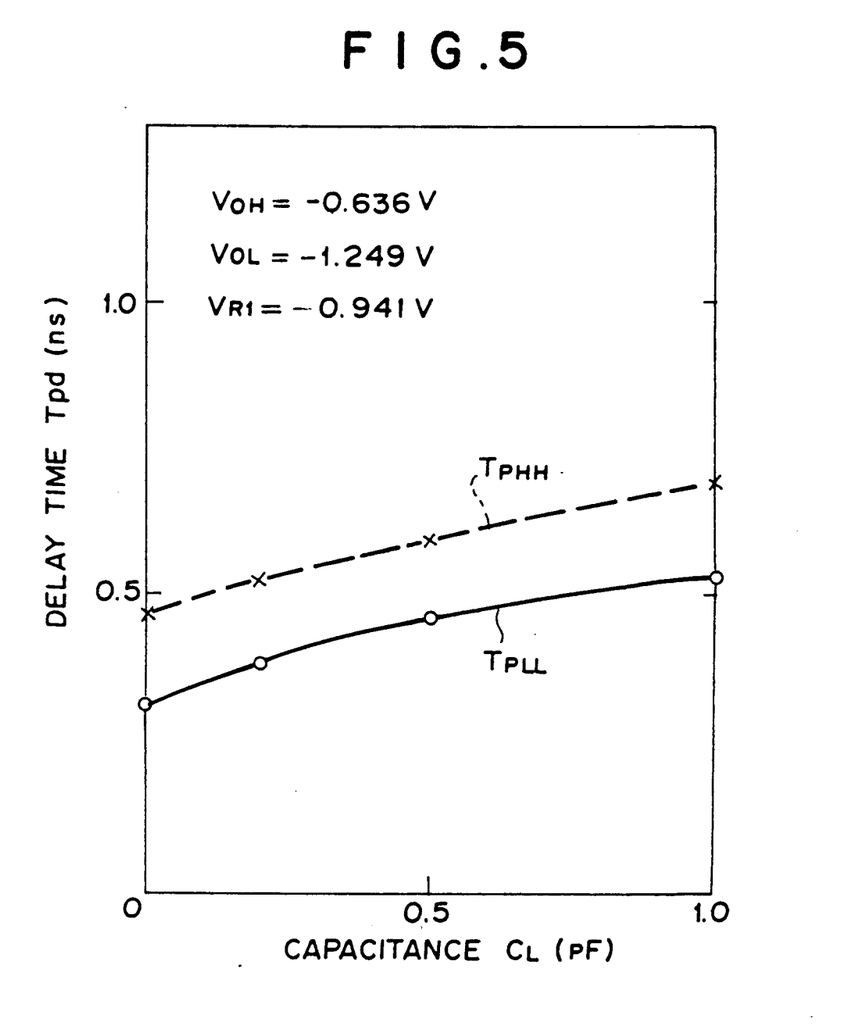
FIGS. 5, 6 and 7 are graphs of the load capacitance dependencies, obtained by simulation, of the delay times in the circuits shown respectively in FIGS. 2, 3 and 4.
Figure 6:
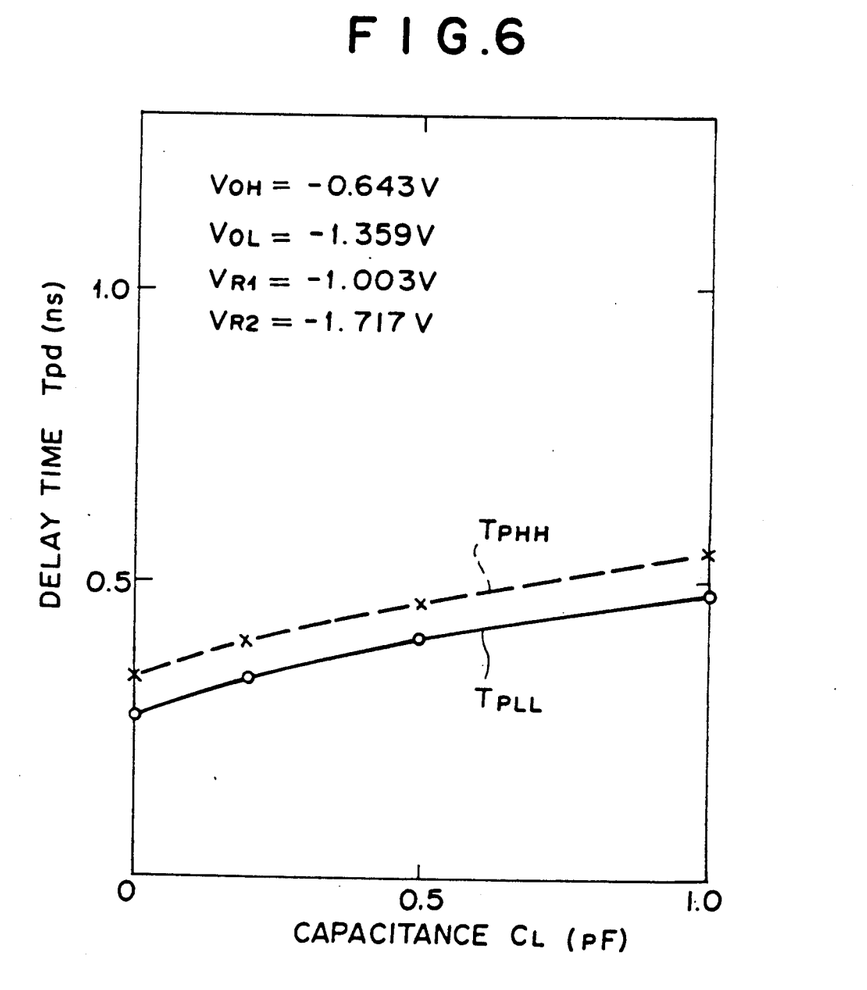
Figure 7:
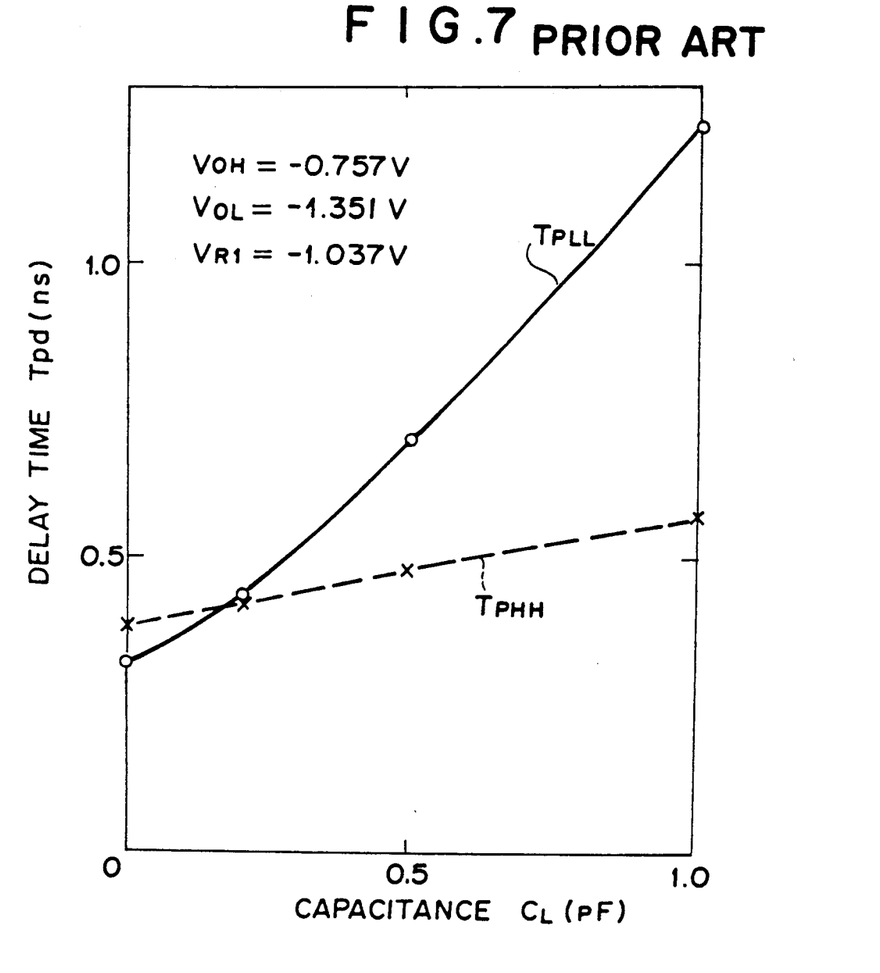
Figure 8A:
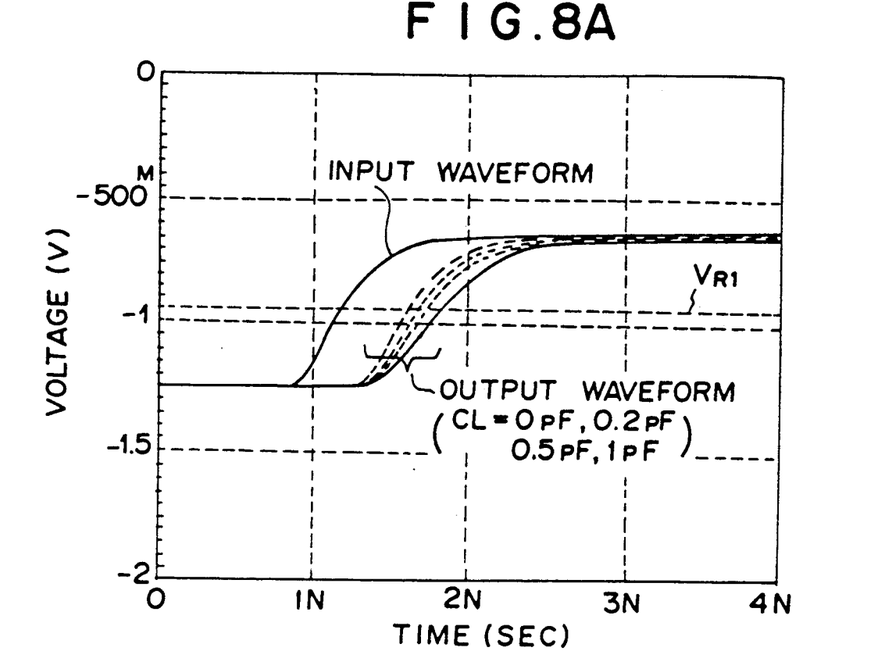
FIGS. 8A, 8B; 9A, 9B; and 10A, 10B are graphs of the load capacitance dependencies, obtained by simulation, of the output waveforms in the circuits shown respectively in FIGS. 2, 3 and 4.
Figure 8B:
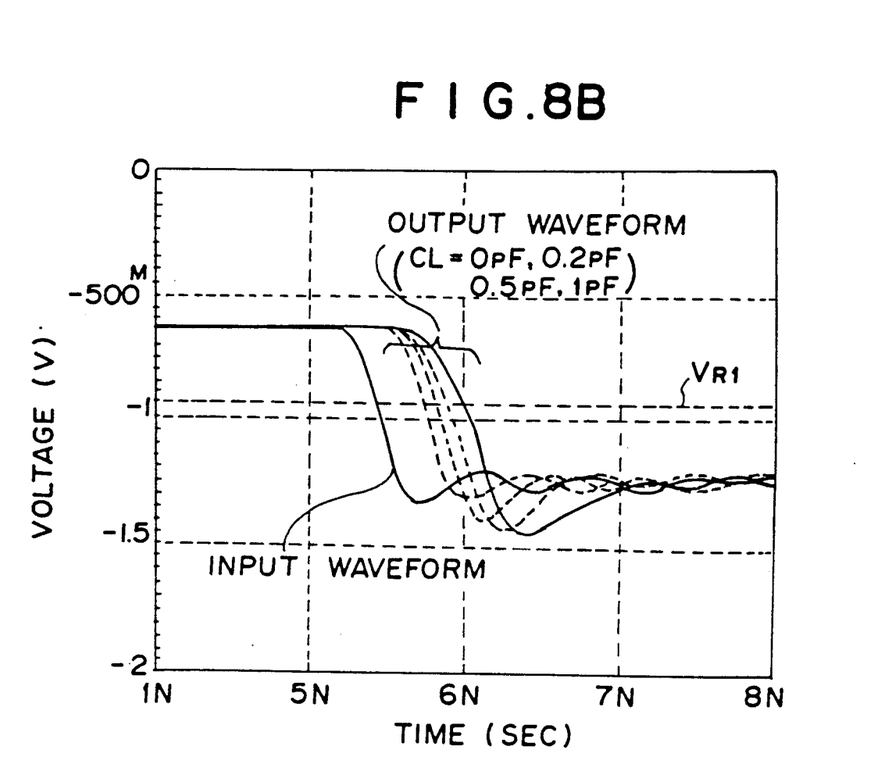
Figure 9A:
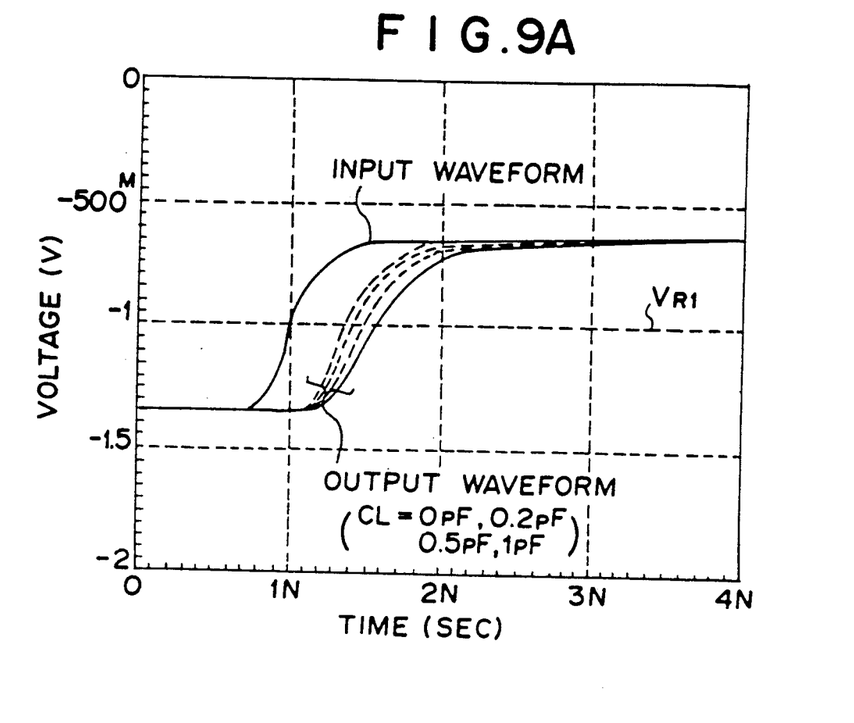
Figure 9B:
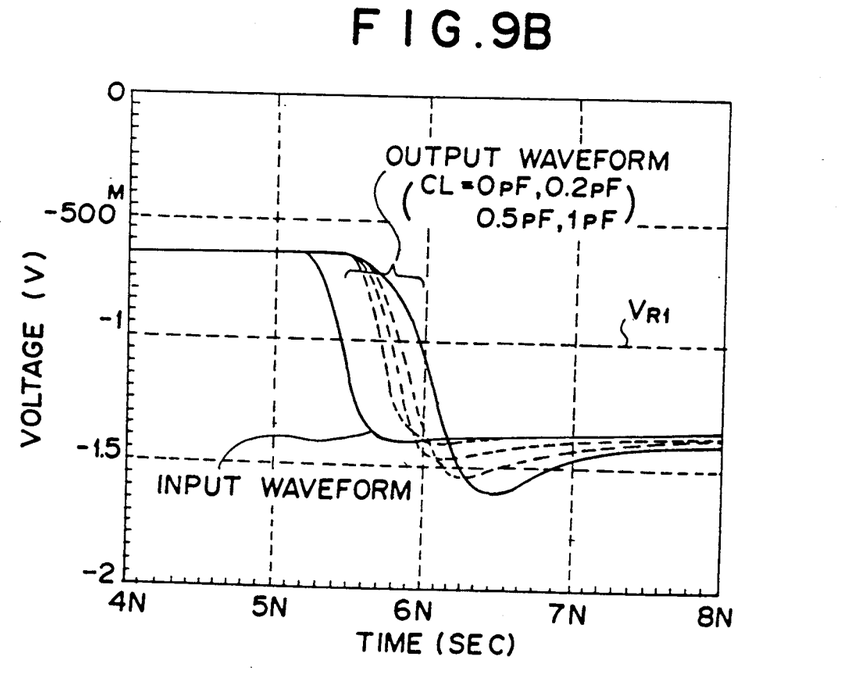
Figure 10A:
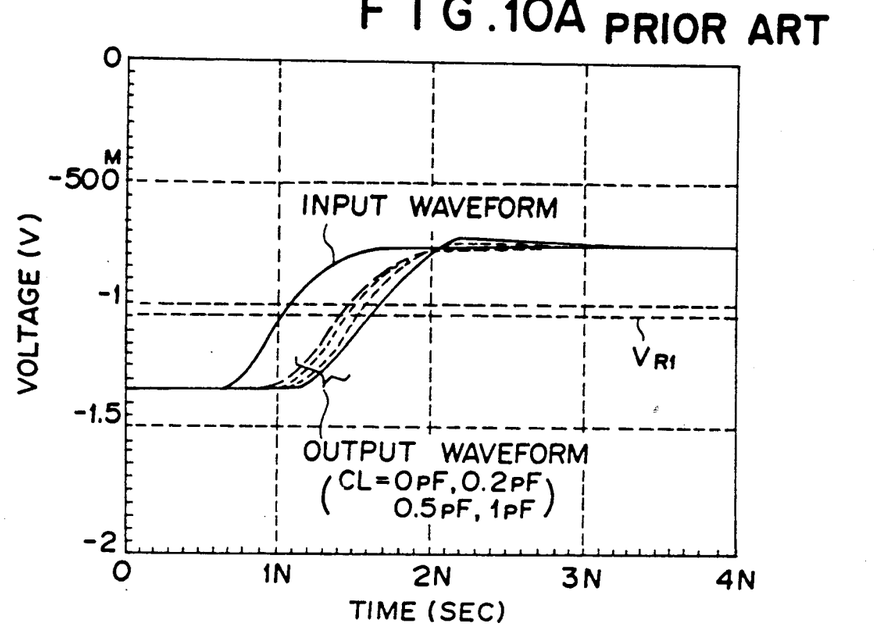
Figure 10B:
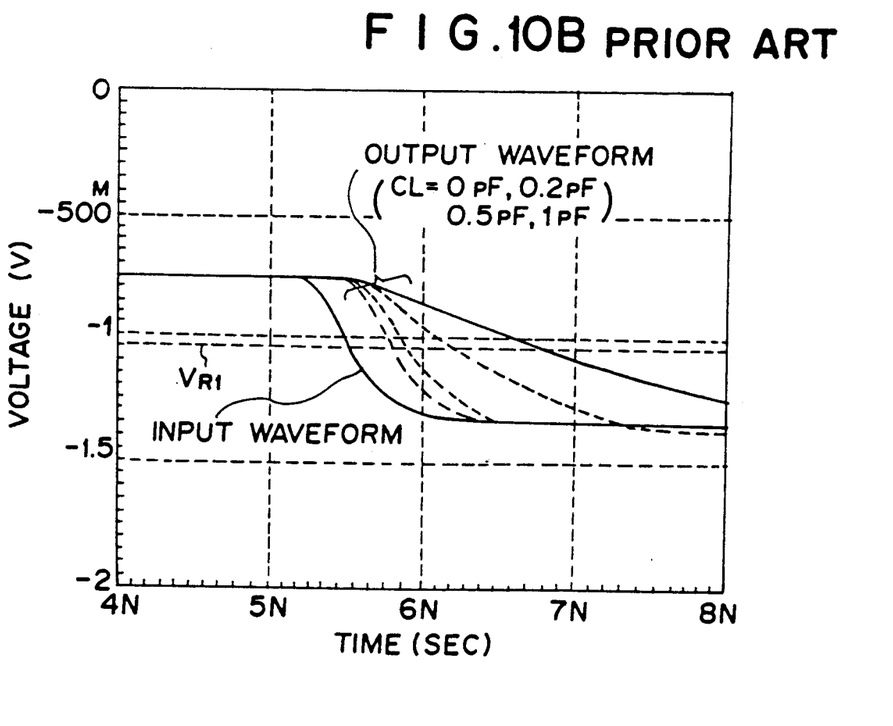

FIGS. 5, 6 and 7 show graphs of the load capacitance dependencies of the delay times in the circuits shown respectively in FIGS. 2, 3 and 4 as results of simulation and, FIGS. 8A, 8B; 9A, 9B; and 10A, 10B similarly show graphs of the load capacitance dependencies of the output waveforms as results of simulation. The used values for the respective elements, etc. in the simulation are as follows:

$R_{11} = R_{12} = 2K\Omega$;
$R_1 = 16K\Omega$;
$R_{13} = 4K\Omega$;
$I_{CS1} = I_{CS2} = I_{CS11} = 0.3$ mA;
$V_{EE} = -4.5$ V; and
$V_T = -2$ V.

As explained in detail in the foregoing, the present invention provides an advantage in that, by arranging that the transistor instead of the terminating resistor in the conventional circuit, which operates by the signal of the inverted phase to the phase of the input signal of the emitter-follower circuit and which turns to its ON-state in the state where the output signal is in its Low state or the output signal changes from its Low to High level, is interposed between the output terminal and the second negative power supply source, the current passage for discharging the charge which was charged in the load capacitance is formed whereby the delay time is effectively reduced. Also, since the transistor keeps its OFF-state when the output signal is at its High-level, the decrease in the noise margin can be prevented.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An emitter-follower circuit having a ground potential terminal and a first and a second negative power supply terminal and a current-switching type logic circuit formed between said ground potential terminal and said first negative power supply terminal, said emitter-follower circuit comprising:
   an emitter-follower transistor having its base connected to one output of said current-switching type logic circuit, its collector connected to said ground potential terminal, and its emitter connected to an output terminal;
   a first transistor having its collector connected to said ground potential terminal and its base connected to the other output of said current-switching type logic circuit;
   a second transistor having its collector connected to said output terminal, its base connected to the emitter of said first transistor, and its emitter connected to said second negative power supply terminal; and
   a diode having its anode connected to the base of said first transistor and its cathode connected to said output terminal.

2. An emitter-follower circuit according to claim 1, which circuit further comprises a first constant-current source disposed between the junction of the emitter of said first transistor with the base of said second transistor and said first negative power supply terminal.

3. An emitter-follower circuit according to claim 1, which circuit further comprises a resistor connected between the junction of the emitter of said first transistor with the base of said second transistor and said first negative power supply terminal.

4. An emitter-follower circuit according to claim 1, which circuit further comprises a resistor between the junction of the emitter of said first transistor with the base of said second transistor and said second negative power supply terminal.

5. An emitter-follower circuit according to claim 1, which circuit further comprises:
   an input emitter-follower circuit formed between the ground potential terminal and the first negative power supply terminal and having a resistor and a third transistor whose base is connected to an input terminal of said current-switching type logic circuit;
   a differential circuit having a fourth transistor whose collector is connected to the emitter of said first transistor and also to the base of said second transistor and whose base is connected to the output of said input emitter-follower circuit, and a fifth transistor whose collector is connected to said ground potential terminal and whose base is connected to a reference voltage source; and
   a second constant-current source connected between said first negative power supply terminal and the emitters of said fourth and fifth transistors of said differential circuit.

* * * * *